United States Patent [19]
Tanigawa

[11] Patent Number: 5,915,957
[45] Date of Patent: Jun. 29, 1999

[54] METHOD OF TRANSFERRING TARGET SUBSTRATES IN SEMICONDUCTOR PROCESSING SYSTEM

[75] Inventor: Osamu Tanigawa, Kanagawa-Ken, Japan

[73] Assignee: Tokyo Electron Limited, Tokyo, Japan

[21] Appl. No.: 09/050,176

[22] Filed: Mar. 30, 1998

[30] Foreign Application Priority Data

Apr. 9, 1997 [JP] Japan ................................... 9-106762

[51] Int. Cl.⁶ .............................. F27D 5/00; F27D 13/00
[52] U.S. Cl. ............................. 432/5; 414/937; 414/804; 414/811; 414/416; 432/241
[58] Field of Search ................... 432/5, 6, 241; 414/937, 804, 811, 416, 331, 198

[56] References Cited

U.S. PATENT DOCUMENTS 5,217,340  6/1993  Harada et al. ........................... 414/937

FOREIGN PATENT DOCUMENTS 7-106402  4/1995  Japan .

Primary Examiner—Teresa Walberg
Assistant Examiner—Jiping Lu
Attorney, Agent, or Firm—Oblon, Spivak, McClelland, Maier & Neustadt, P.C.

[57] ABSTRACT

Semiconductor wafers are transferred from a closed type cassette into a wafer boat. First, the lowermost five wafers of 13 wafers held in the cassette are simultaneously transferred by five arms from the cassette into the uppermost part of the wafer boat. Then, the lowermost three wafers among the wafers left in the cassette are simultaneously transferred by the upper three arms from the cassette into the boat immediately under the five wafers previously transferred. Further, the uppermost five wafers left in the cassette are simultaneously transferred by the five arms from the cassette into the boat immediately under the eight wafers previously transferred.

20 Claims, 6 Drawing Sheets

METHOD OF TRANSFERRING TARGET SUBSTRATES IN SEMICONDUCTOR PROCESSING SYSTEM

BACKGROUND OF THE INVENTION

The present invention relates to a method of transferring target substrates in a semiconductor processing system, particularly, to a method of transferring semiconductor wafers from a cassette (container) into a boat for a heat treatment. The term "semiconductor processing" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the manufacturing process of a semiconductor device, a vertical heat treating system is employed, so that a heat treatment such as oxidation or diffusion is applied in a single step to a plurality of semiconductor wafers. FIG. 8 schematically shows a vertical heat treating system of this type.

In carrying out a heat treatment by using the vertical heat treating system, wafers W held in a cassette 11 are transferred by a transfer apparatus 12 into a wafer boat 13. Then, the boat 13 is loaded by a boat elevator 14 into a vertical furnace 15 for applying a predetermined heat treatment to the wafers W. After the heat treatment, the wafers W are transferred from the boat 13 back into the cassette 11. Then, untreated wafers W are transferred from another cassette 11 into the boat 13 for applying a heat treatment to these wafers W.

The inner wall of the cassette 11 is provided with a plurality of grooves (not shown), into which the peripheral portions of the wafers W are inserted, such that a plurality of wafers W can be held in a stacked state with a distance therebetween within the cassette 11. On the other hand, the boat 13 has, e.g., three support rods provided with grooves (not shown), into which the peripheral portions of the wafers are inserted, such that a large number of wafers W can be held in a stacked state with a distance therebetween within the boat 13. The number of wafers W which can be held in the boat 13 is larger than that of wafers held in the cassette 11.

The transfer apparatus 12 comprises a plurality of transfer arms 12a, e.g., five transfer arms. These five transfer arms can be moved back and forth, up and down and can be swung simultaneously. Also, one of the five arms 12a, e.g., the central arm 12a, can be moved back and forth independent of the other 4 arms 12a. Since 25 wafers are generally held in a single cassette 11, the transfer apparatus 12 is provide with the five arms 12a, so that all the wafers held in the cassette 11 can be taken out by the five arms 12a without bringing about a fractional number of wafers.

In transferring the wafers W from the cassette 11 into the boat 13, the five arms 12a of the transfer apparatus 12 are moved into positions immediately under the wafers W which are to be held by these arms 12a, respectively. Then, the transfer apparatus 12 is moved up to cause each of the arms 12a to pick up the wafers W. Then, the arms 12a are moved backward, and the transfer apparatus 12 is swung and moved in a vertical direction to cause the arms 12a holding the wafers W to face a predetermined position of the boat 13. Then, the arms 12a are moved forward so as to cause the peripheral portions of the wafers W to be inserted into the grooves formed in the support rods of the boat 13. Then, the transfer apparatus 12 is moved down so as to deliver the wafers W to the boat 13.

In recent years, the semiconductor device is made finer and finer, and it is important to more effectively suppress formation of a spontaneous oxide film and generation of particles. To meet this requirement, a closed type cassette including a lid, which permits maintaining a high cleanliness within the cassette, is widely used nowadays in place of a conventional open type cassette. In general, the closed type cassette is constructed to house 13 wafers.

Where the transfer apparatus 12 provided with the five arms 12a is used for transferring wafers W from the closed type cassette into the boat 13, it is customary to employ the following transfer method. Specifically, the method combines a step of moving the five arms 12a back and forth simultaneously to hold five wafers and another step of moving only one of these five arms back and forth to hold a single wafer W. For example, the step of simultaneously moving five arms is performed twice, with the step of moving only one arm is performed three times, so as to transfer 13 wafers held in the closed type cassette into the boat 13 by five moving steps.

It is also known to the art to use a transfer apparatus provided with four transfer arms. In this case, these four transfer arms are simultaneously moved back and fourth three times, and only one transfer arm is moved back and forth once, so as to transfer 13 wafers held in the closed type cassette into the boat 13 by four moving steps.

The time required for transferring the wafers from the cassette 11 into the boat 13 is increased with an increase in the number of moving steps of a transfer apparatus. It should be noted that the wafers must be transferred between the cassette 11 and the boat 13 both before and after the heat treatment. Accordingly, the total time required for transferring the wafers for the heat treatment is twice the time required for the one way transfer, leading to a low throughput of the heat treatment.

BRIEF SUMMARY OF THE INVENTION

An object of the present invention is to provide a method of transferring target substrates in a semiconductor processing system, which permits shortening the transfer time by decreasing the number of moving steps of a transfer apparatus for transferring the substrate.

According to the present invention, there is provided a method of transferring a plurality of target substrates by a transfer apparatus from a first holder to a second holder in a semiconductor processing system, the first holder holding a (KN+M)-number of target substrates in a stacked state with a distance therebetween, the second holder being capable of holding at least a (KN+M)-number of target substrates in a stacked state with a distance therebetween, and the transfer apparatus having an N-number of arms, which are movable back and forth simultaneously, for respectively supporting target substrates in a stacked state with a distance therebetween, where K is an integer of at least 2, N is an integer of at least 2, and M is an integer of at least 1 and smaller than N, the method comprising:

a first step of simultaneously transferring an N-number of target substrates, which are the lowermost ones of the (KN+M)-number of target substrates held in the first holder, from the first holder into the second holder by the N-number of arms;

a second step, after the first step, of simultaneously transferring an M-number of target substrates, which are the lowermost ones of a {(K−1)N+M}-number of target substrates left in the first holder, from the first holder into the second holder by an M-number of arms, which are the uppermost ones of the N-number of arms; and a third step, after the second step, of simultaneously transferring an N-number of target substrates, which are ones of a (K−1)N-number of target substrates left in the first holder, from the first holder into the second holder by the N-number of arms.

In the transfer method of the present invention, the transfer apparatus can be operated in accordance with a predetermined operating sequence even in the absence of any one of the (KN+M)-number of target substrates held in the first holder.

Incidentally, the first holder consists of, for example, a cassette housing the target substrates. On the other hand, the second holder consists of, for example, a boat used in a vertical heat treating system.

To be more specific, an N-number of target substrates are simultaneously taken out of the first holder in each of the first step and the third step (or final step). Also, an M-number, i.e., a fractional number, of target substrates are taken out of the first holder between the first and final steps. The uppermost M-number of arms among the N-number of arms of the transfer arms are used for taking the M-number of target substrates out of the first holder. Suppose, for example, a (KN+M)-number of target substrates, where K=3, N=5 and M=3, i.e., 18 target substrates, are held in the first holder, and a transfer apparatus is equipped with five arms. Where these 18 target substrates are transferred by the transfer apparatus from the first holder into the second holder, the lowermost five target substrates are simultaneously transferred (the first step), then the fractional three target substrates are simultaneously transferred (the second step), then five target substrates out of remaining ten are simultaneously transferred, and finally the remaining five target substrates are simultaneously transferred (the third step). It should be noted, however, that the simultaneous transfer of the fractional three target substrates and the intermediate simultaneous transfer of the five target substrates, can be performed in the reversed order.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
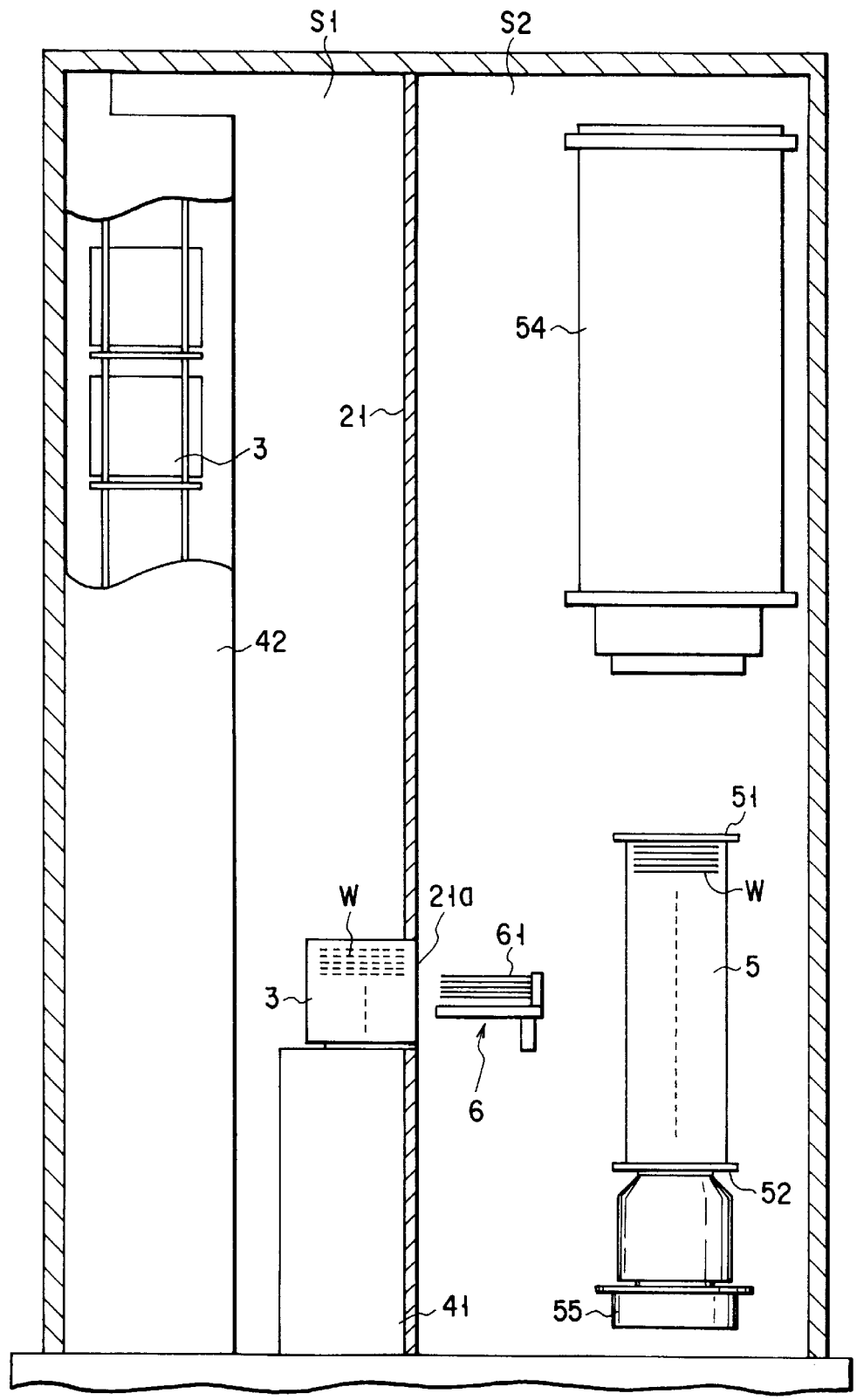
FIG. 1 is a cross sectional view showing a vertical heat treating system of semiconductor wafers according to an embodiment of the present invention.
Figure 2:
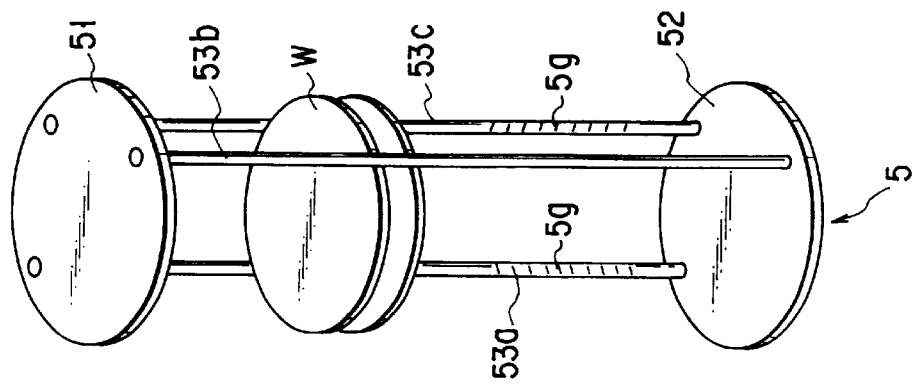
FIG. 2 is a perspective view showing the relationship among the cassette, wafer boat and transfer apparatus in the system shown in FIG. 1.
Figure 2:
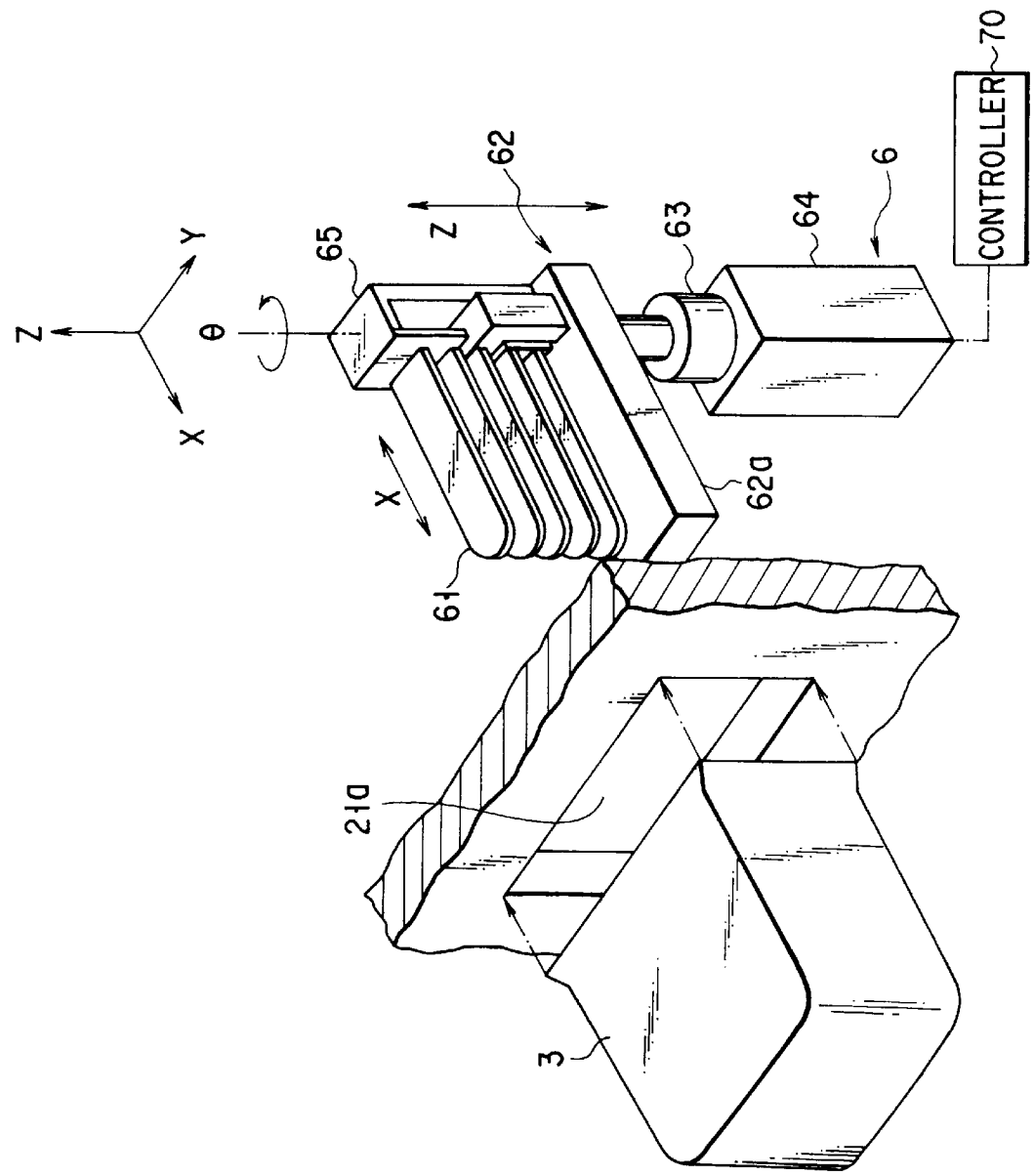

FIG. 1 is a cross sectional view showing a vertical heat treating system according to an embodiment of the present invention, and FIG. 2 is a perspective view showing its main part.

In terms of the whole structure of the vertical heat treating system, it is partitioned by a wall 21 into a first region S1 and a second region S2. Formed in the wall 21 is a transfer port 21a, to which a closed type cassette 3 is attached. The transfer port 21a is normally closed by a lid 36 shown in FIG. 3.

A cassette table 41 for supporting the closed type cassette 3 is arranged below the transfer port 21a in the first region S1. In front of the transfer port 21a, there is a stockroom 42 in which a plurality of closed type cassettes 3 are vertically arranged one upon the other. The cassette 3 is transferred between the cassette table 41 and the stockroom 42 by a transport mechanism (not shown).

Figure 3:
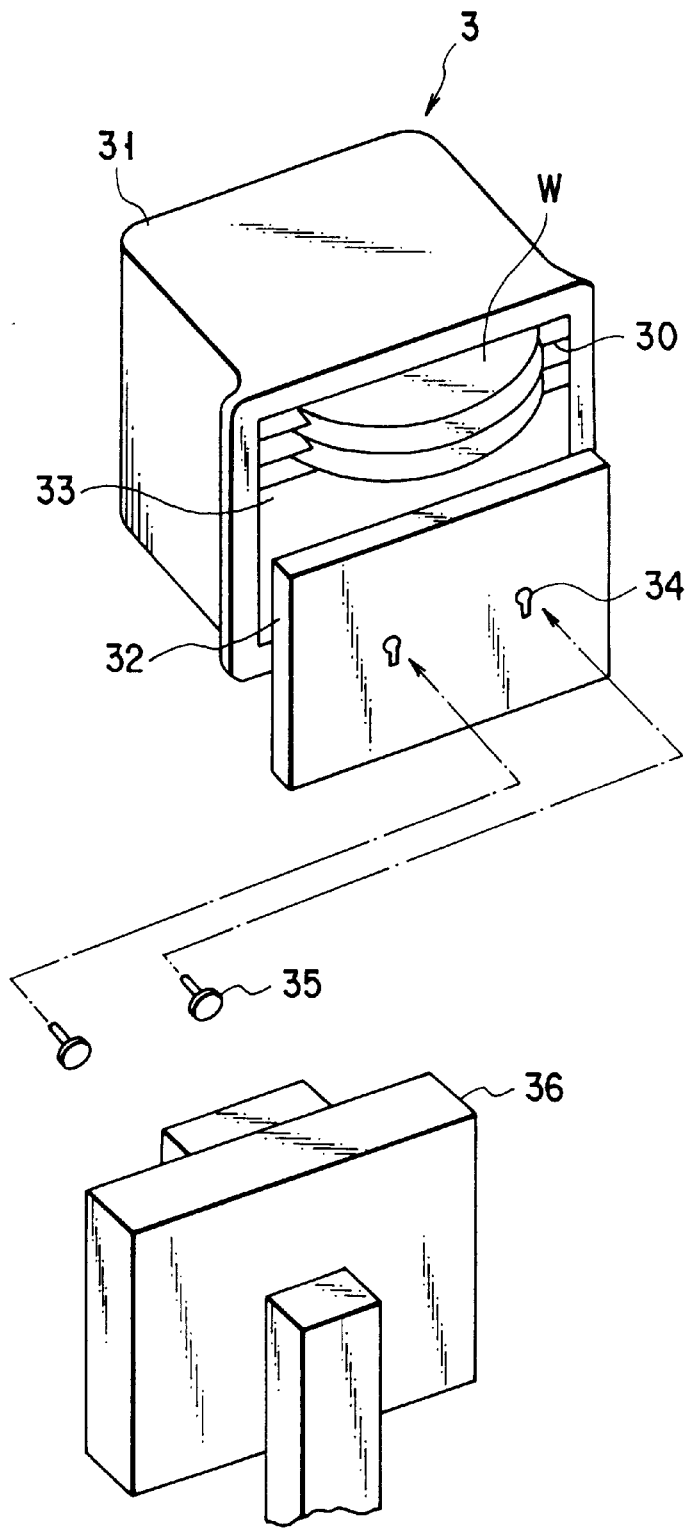
FIG. 3 is a perspective view showing the cassette used in the present invention.

FIG. 3 shows the closed type cassette 3. As shown in the drawing, the cassette 3 (first holder) includes a cassette body 31 capable of housing a plurality of semiconductor wafers, i.e., target substrates. For example, the cassette body has grooves 30 defining a (KN+M)-number of holding places, so that a (KN+M)-number of, e.g., 13 (K=2, N=5, M=3), semiconductor wafers are held in a stacked state with a distance therebetween. Each of K and N denotes an integer of at least 2, while M denotes an integer of at least 1 and smaller than N. Specifically, N denotes the number of arms of the transfer apparatus, i.e., N=5 in this embodiment. The method of the present invention produces a greater effect in the case where M is at least 2 and/or N is at least 4.

An opening 33 through which the wafer W is taken out of the cassette body 31 is hermetically closed by a lid 32. A plurality of key holes 34, e.g., two key holes, are formed in the lid 32. If keys 35 are inserted into and turned inside the key holes 34, lock pins (not shown) are caused to project from the upper and lower end portions of the lid 32, with the result that the lid 32 is fixed to the cassette body 31.

In the wafer transfer section within the second region S2, a wafer boat 5 (second holder) is disposed on a boat elevator 55. As shown in FIG. 2, the boat 5 includes a circular ceiling plate 51, a circular bottom plate 52 and three support rods 53a to 53c connecting them. The support rods 53a and 53b are arranged along the circumferential line in one semi-circle region of the circle defined by the projected view of the ceiling and bottom plates 51 and 52, so that an entrance for inserting the wafers W is formed in another semi-circle region.

The boat 5 has, e.g., 100 holding places, so that 100 wafers can be held in a stacked state with a distance therebetween. In order to define the holding places, each of the support rods 53a to 53c is provided with 100 grooves 5g (part of which is shown in FIG. 2). The wafers W are held horizontally in the holding places with their peripheral portions inserted into the grooves 5g of the support rods 53a to 53c. The number of wafer holding grooves 5g are not necessarily limited to 100. However, it is absolutely necessary for the number of grooves 5g to be equal to or larger than the number of wafers held by a single cassette 3, i.e., (KN+M), in working the transfer method of the present invention.

A heat treating furnace 54 is arranged above the wafer transfer section in which is arranged the wafer boat 5. The boat 5 is moved in a vertical direction by a boat elevator 55, which also acts as a lid of the heat treating furnace 54, for loading/unloading the wafers W into/out of the heat treating furnace 54. The second region S2 can be evacuated to a degree of vacuum substantially equal to that of the heat treating furnace 54, e.g., to a vacuum of 1 Torr.

Within the second region S2, a transfer apparatus 6 having, N number of, e.g., five, arms 61 is arranged between the wafer transfer port 21a and the wafer transfer section. As shown in FIG. 2, the transfer apparatus 6 includes an X driver 62, a θ driver 63 and a Z driver 64 for driving the transfer arms 61 in X, θ and Z directions, respectively. The X driver 62 drives the arms 61 back and forth in an X-direction on a base 62a supporting the arms 61 as described herein later in detail. The θ driver 63 drives all the arms 61 to be swung about a vertical axis (θ direction) together with the base 62a. On the other hand, the Z driver 64 drives all the arms 61 to be moved in a vertical direction (Z direction) together with the base 62a. These drivers 62 to 64 are controlled by a controller 70, and thus the operations of the arms 61 are controlled within a driving coordinate system set within the controller 70.

Figure 5A:
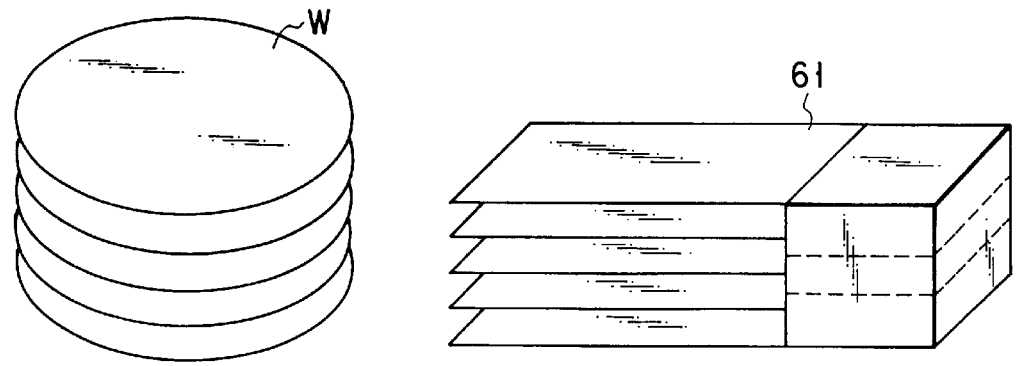
FIGS. 5A and 5B are perspective views schematically showing the relationship between the transfer apparatus and wafers.
Figure 5B:
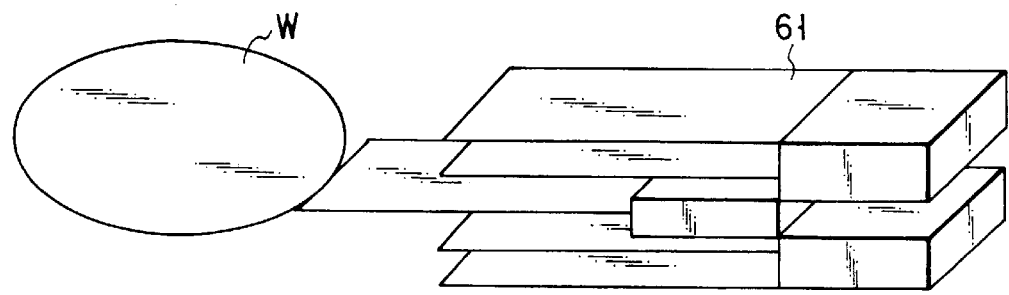

The supporting section of each arm 61 consists of a thin plate extending horizontally in a reciprocating movement direction and provided with a concave portion (not shown) on its upper surface so as to cause the wafer W to be disposed at a predetermined position. Since five arms 61 are arranged one upon the other, five wafers W can be transferred simultaneously. It should be noted that the central arm 61 is capable of performing a reciprocating movement independently of the other four arms 61, as shown in FIGS. 5A and 5B. It follows that the wafers W can be transferred one by one by the central arm 61. The other four arms 61 are made integral at the proximal end portions by a supporting section 65 and connected to a driving mechanism arranged within the base 62a. The central arm 61 is connected to another driving mechanism arranged within the base 62a.

In the vertical heat treating system of the construction described above, the wafers W are transferred by the transfer apparatus 6 between the closed type cassette 3 disposed on the cassette table 41 and the wafer boat 5 arranged in the transfer section below the heat treating furnace 54, as follows. It should be noted that the operations of the transfer apparatus 6 in the first to third steps are automatically carried out in accordance with a program stored in the controller 70. According to the program, the transfer apparatus is operated in accordance with a predetermined operating sequence even in the absence of a wafer W in any of the wafer holding places within the cassette 3. Such being the situation, the following description is made on the ideal case where the wafers W are held in all the wafer holding places of the cassette 3 so as to facilitate understanding of the technical idea of the present invention.

First, the cassette 3 is disposed on the cassette table 41 within the first region S1 so as to attach the cassette 3 to the transfer port 21a. Then, the keys 35 are inserted into the key holes 34 by an opening and closing mechanism (not shown) which is arranged in the lid 36 closing the transfer port 21a. The lock pins are released by the keys 35, and the lid 32 of the cassette 3 is detached along with the lid 36 from the transfer port 21a.

Since there is a hermetic seal between the transfer port 21a and the cassette body 31, the first and second regions S1 and S2 are airtightly isolated from each other even after the lid 32 is detached. In other words, the first and second regions S1 and S2 are always airtightly isolated from each other by the lid 36 when no cassette 3 is attached to the transfer port 21a, or by the cassette body 31 when the cassette 3 is attached to the transfer port 21a.

Figure 4A:
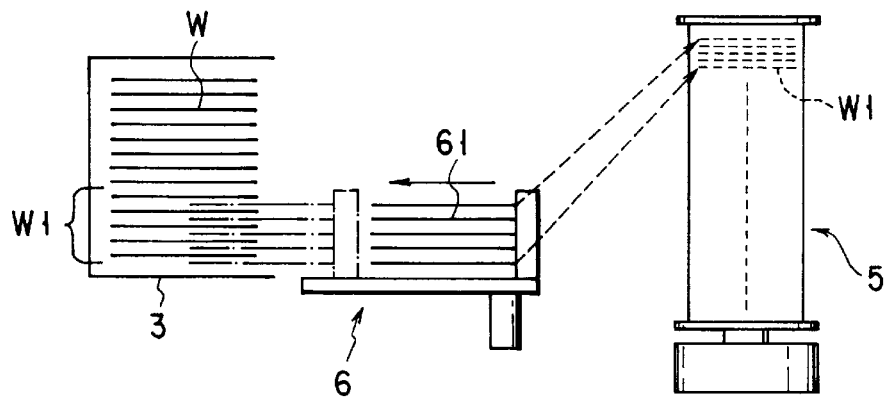
FIGS. 4A to 4C show the steps of a method of transferring wafers in order, according to an embodiment of the present invention.

Next, the five arms 61 are operated simultaneously so as to take the lowermost five wafers W1 out of the cassette 3, and to transfer these five wafers W1 into the uppermost wafer holding places of the wafer boat 5, as shown in FIG. 4A (first step). In this step, the five arms 61 are moved into positions immediately under the wafers W1 to be taken out. Then, the transfer apparatus 6 are moved up so as to pick up and receive the wafers W1 by the arms 61. Then, the arms 61 are moved backward, followed by swinging the transfer apparatus 6 and, at the same time, moving the transfer apparatus 6 in a vertical direction so as to cause the arms 61 holding the wafers W1 to face a predetermined position of the boat 5. Then, the five arms 61 are moved forward so as to cause the peripheral portions of the wafers W1 to be inserted into the holding grooves 5g of the boat 5. Then, the transfer apparatus 6 are moved down so as to deliver the wafers W1 onto the boat 5.

Figure 4B:
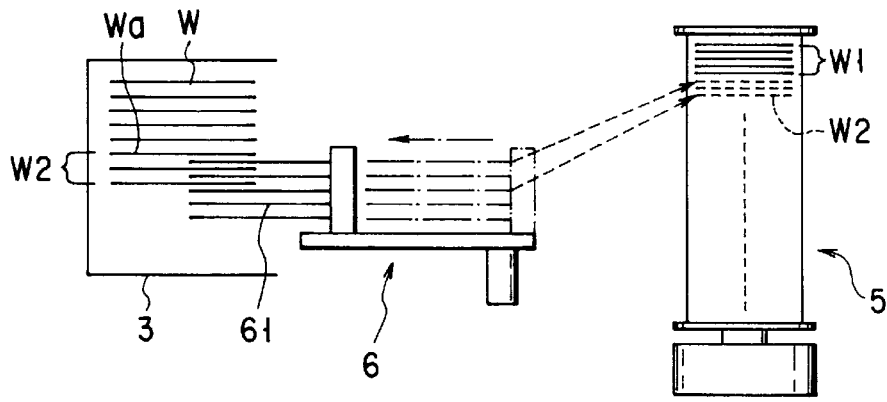

Next, the five arms 61 are operated simultaneously so as to take the lowermost three wafers W2, among the wafer W remaining within the cassette 3, out of the cassette 3, and to transfer these three wafers W2 into the boat 5, as shown in FIG. 4B (second step). These wafers W2 are positioned immediately under the five wafers W1 transferred into the boat 5 in the first step. In order to take these wafers W2 out of the cassette 3, the position of the five arms 61 in the Z direction is adjusted such that the uppermost arm 61 is positioned immediately under the third lowermost wafer Wa, among the wafer W remaining within the cassette 3, followed by moving the five arms 61 into the cassette 3. As a result, the three upper arms 61 are positioned immediately under the three wafers W2, respectively, which are to be taken out of the cassette 3. Under this condition, the three wafers W2 are taken out of the cassette 3.

Figure 4C:
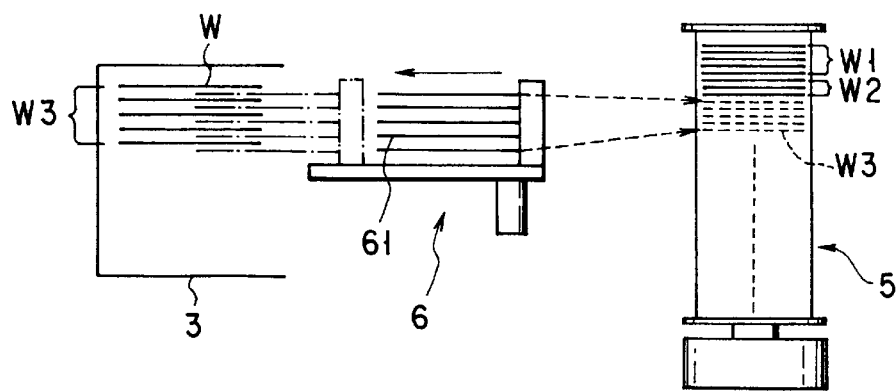

Finally, the five arms 61 are operated simultaneously so as to take the uppermost five wafers W3 remaining within the cassette 3, out of the cassette 3, and to transfer these five wafers W3 into holding places of the wafer boat 5, as shown in FIG. 4C (third step). These five wafers W3 are positioned immediately under the three wafers W2 transferred into the boat 5 in the second step. In this fashion, the 13 wafers W held in the cassette 3 are transferred into the uppermost 13 wafer holding places of the boat 5.

After all the wafers W held in the cassette 3 have been transferred into the boat 5, a plurality of other closed type cassettes 3 are disposed successively on the cassette table 41 so as to transfer 100 wafers into the boat 5 as described above. Incidentally, the 100 wafers transferred into the boat 5 may include dummy wafers or monitor wafers, as described herein later. The boat 5 housing 100 wafers W is moved up by the boat elevator 55 into the heat treating furnace 54 so as to apply a predetermined heat treatment to the wafers W held in the boat 5.

After completion of the heat treatment, the boat 5 is moved down by the boat elevator 55 to the transfer section under the heat treating furnace 54, thereby unloading the boat 5 from the heat treating furnace 54. Then, the treated wafers W are transferred by the transfer apparatus 6 from the boat 5 into the closed type cassette 3, as follows.

First, the lowermost five wafers W held in the boat 5 are taken out of the boat 5 by the five arms 61, and are transferred into the uppermost five wafer holding places of the cassette 3. Then, the lowermost three wafers W, among the wafers W remaining inside the boat 5, are taken out by the three upper arms 61, and are transferred into the three wafer holding places of the cassette 3 immediately below the five wafers W transferred previously into the cassette 3. Then, the lowermost five wafers W, among the wafers W remaining inside the boat 5, are taken out by the five arms 61, and are transferred into the five wafer holding places of the cassette 3 immediately below the three wafers W transferred previously into the cassette 3.

As described above, in the transfer method of the target substrate according to this embodiment, the lowermost five wafers W held in the cassette 3 are taken out in the first step. Then, the lowermost three wafers W, among the wafers W remaining in the cassette 3, are taken out by the three upper arms 61 in the second step. In this step, the two lower arms 61 are inserted into the vacant regions of the cassette 3 to cause the remaining three upper arms 61 to take out the three wafers W. The particular construction of the present invention makes it possible to take out a fractional number of wafers smaller than the number of arms 61, i.e., three wafers in this embodiment, can be taken out simultaneously. It follows that the 13 wafers W held in the cassette 3 can be transferred into the boat 5 by operating the transfer apparatus 6 only three times. Accordingly, the number of moving steps of the transfer apparatus can be decreased, compared with the prior art, leading to shortening of the time required for the wafer transfer and, thus, to an increased through-put of the heat treatment.

In the embodiment described above, the wafers W positioned in a lower region of the cassette 3 are taken out first. It should be noted in this connection that, if the wafers W positioned in an upper region of the cassette 3 are taken out first, the dust which may possibly be generated during the transfer operation falls down to contaminate the wafers positioned in the lower region of the cassette 3. It should also be noted that, where the wafers W positioned in a lower region of the cassette 3 are taken out first as in the embodiment described above, it is impossible to carry out the step of transferring a fractional number of wafers W like the second step included in the embodiment described above, as the first or last step of the operating sequence. In other words, the number of wafers W transferred in each of the first and last steps is required to be equal to the number of arms 61, i.e., five.

Suppose the step of transferring a fractional number of wafers is carried out first. In this case, the two lower arms 61 abut against the lower portion of the cassette 3, if the three upper arms 61 are to be inserted into the cassette 3 for taking out the lowermost three wafers W held in the cassette 3. On the other hand, if the three lower arms 61 are to be used for taking out the lowermost three wafers W held in the cassette 3, the two upper arms 61 abut against the wafers W positioned above the three wafers W which are to be taken out.

Suppose the step of transferring a fractional number of wafers is carried out as the last step. In this case, the three wafers W remaining in the cassette 3 can be taken out by using three upper arms 61. However, the two lower arms 61 abut against the bottom plate 52 of the boat 5 (or a dummy wafer, if mounted in the boat 5), where the remaining number of wafer holding places of the boat 5 is equal to the fractional number of wafers W. On the other hand, if the three lower arms 61 are to be used for taking the remaining three wafers W out of the cassette 3, the two upper arms 61 abut against an upper portion of the cassette 3.

As described above, the wafers W are transferred first into upper holding places of the boat 5. This is because, where wafers W are not held in the lower stages, the dust, which may be generated in the wafer transfer step and which may fall down, does not contaminate the other wafers W held in the boat 5. The wafer transfer method according to this embodiment is based on the particular technical idea. What should also be noted is that, if the wafers W are to be transferred first into a lower region of the boat 5, the two lower arms 61, which do not hold the wafers W, abut against the wafers W transferred in the previous step into the boat 5. In short, the present invention realizes an optimum sequence in accordance a rule such that the wafers are taken out from the lower region of the cassette 3 and transferred into the upper region of the boat 5.

Figure 6:
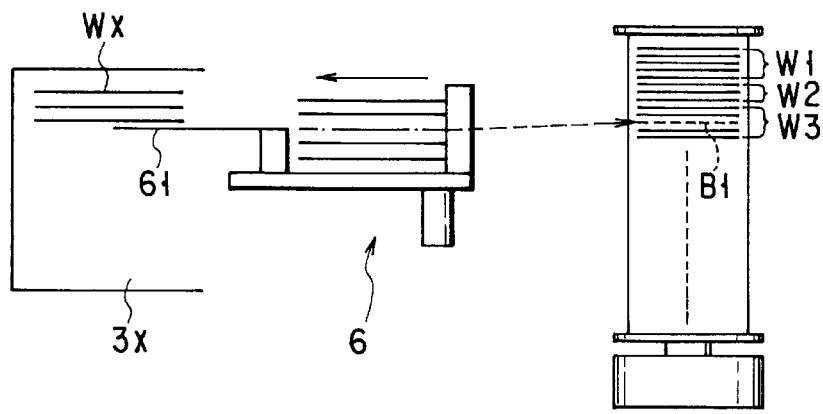
FIG. 6 is a view showing that a substitute wafer is transferred into a vacant position of the boat in the wafer transfer method according to the embodiment of the present invention.

It should be noted that the operation of the transfer apparatus 6 in the first to third steps is automatically carried out in accordance with a predetermined operating sequence on the basis of the program set in the controller 70. Accordingly, in the event of absence of a single wafer W in any of the wafer holding places within the cassette 3, a blank B1 corresponding to the absence of the single wafer W takes place in the wafer holding places of the boat 5, as shown in FIG. 6. In this case, a substitute wafer Wx held in another cassette 3x can be supplemented in the blank B1 by using the central arm 61 which can be moved back and forth independently of the other arms 61. It is possible for the substitute wafer Wx to be a semiconductor wafer equivalent to the (KN+M)-number of semiconductor wafers W held in the closed type cassette 3. Alternatively, it is possible for the substitute wafer Wx to be a dummy wafer which is used not to impair the uniformity of the treating conditions of the semiconductor wafers within the heat treating furnace 54, though a semiconductor device is not formed in the dummy wafer itself.

Figure 7:
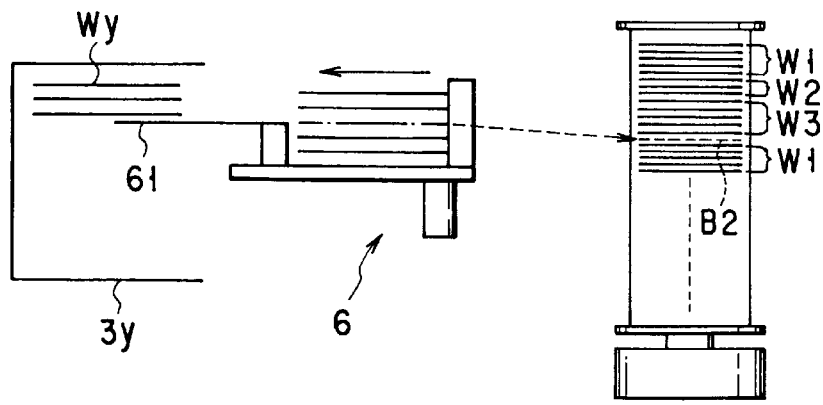
FIG. 7 is a view showing that a monitoring wafer is transferred into the boat in the wafer transfer method according to the embodiment of the present invention.
Figure 8:
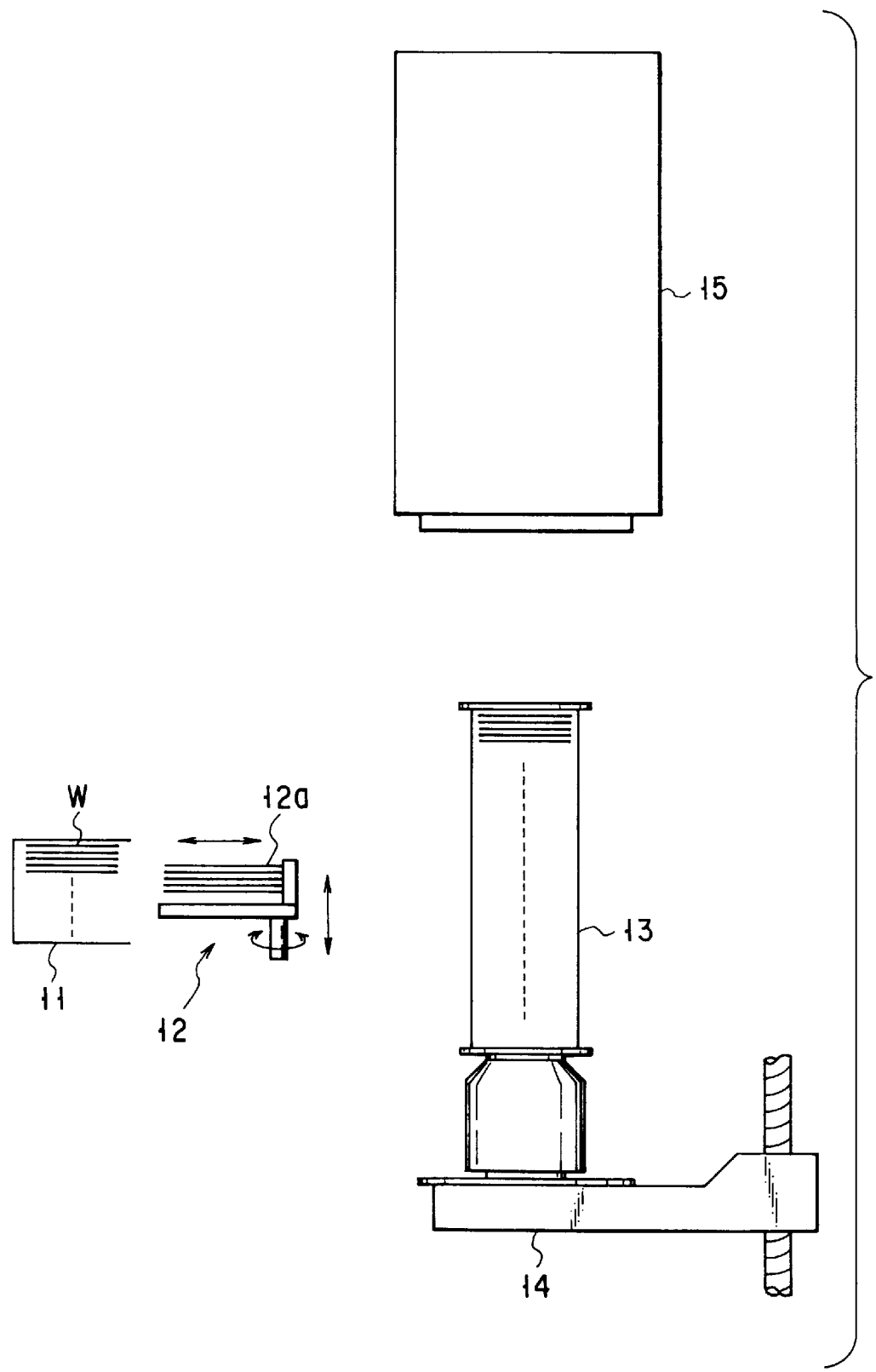
FIG. 8 is a cross sectional view showing the conventional vertical heat treating system of semiconductor wafers.

It is also possible for the boat 5 to house a monitor wafer Wy for monitoring the heat treating conditions within the heat treating furnace 54. In general, the monitor wafer Wy is inserted between adjacent lots of 13 wafers W corresponding to one cassette 3. To be more specific, in transferring the wafers W from a plurality of closed type cassettes 3 into the boat 5, a blank B2 is formed in the wafer holding places of the boat 5 such that the blank B2 is left between adjacent lots of 13 wafers W corresponding to one cassette 3, as shown in FIG. 7. Then, a monitor wafer Wy held in another cassette 3y is transferred into the blank B2 by using the central arm 61 movable back and forth independently of the other arms 61.

Let us describe the first to third steps included in the transfer method of the present invention in terms of the general expression. In the following description, the terms "first holder" and "second holder" correspond to the closed type cassette 3 and the wafer boat 5, respectively. Further, the term "target substrate" used in the following description corresponds to the wafer W.

Specifically, in the first step, an N-number of target substrates, which are the lowermost ones of a (KN+M)- number of target substrates held in the first holder, are simultaneously transferred from the first holder into a second holder by an N-number of arms. In the second step, an M-number of target substrates, which are the lowermost ones of a {(K−1)N+M}-number of target substrates left in the first holder, are simultaneously transferred from the first holder into the second holder by an M-number of arms, which are the uppermost ones of the N-number of arms. Further, in the third step, an N-number of target substrates, which are ones of a (K−1)N-number of target substrates left in the first holder, are simultaneously transferred from the first holder into the second holder by the N-number of arms.

The particular transfer method of the present invention permits decreasing the number of moving steps of the transfer apparatus required for transferring the (KN+M)-number of target substrates, making it possible to increase the through-put of the semiconductor processing. In respect of the effect of decreasing the number of operations of the transfer apparatus, it is desirable for M to be at least 2 and/or for N to be at least 4.

In addition to the embodiment described above, the transfer method of the present invention based on the particular technical idea can be worked in various other fashions.

For example, a transfer apparatus provided with four arms can be used for transferring, for example, 11 target substrates, {K=2, N=4, M=3 in (KN+M)}, between the first holder and the second holder. Specifically, in the first step, the lowermost four target substrates are simultaneously transferred from the first holder into a second holder by the four arms. In the second step, the lowermost three target substrates among the target substrates left in the first holder are simultaneously transferred from the first holder into the second holder by the uppermost three arms. Further, in the third step, the four target substrates left in the first holder are simultaneously transferred from the first holder into the second holder by the four arms.

Further, a transfer apparatus equipped with five arms can be used for transferring, for example, 18 target substrates, {K=3, N=5, M=3 in (KN+M)}, between the first holder and the second holder. Specifically, in the first step, the lowermost five target substrates are simultaneously transferred from the first holder into a second holder by the five arms. In the second step, the lowermost three target substrates among the target substrates left in the first holder are simultaneously transferred from the first holder into the second holder by the uppermost three arms. Further, in the third step, the five target substrates left in the first holder are simultaneously transferred from the first holder into the second holder by the five arms. In this case, another five target substrates, which are not mentioned above, can be simultaneously transferred from the first holder into the second holder by the five arms between the first and second steps described above. Instead, this step may be performed between the second and third steps.

The present invention can be applied to a system other than the vertical heat treating system. For example, where target substrates held in a closed type cassette are heat treated one-by-one, the target substrates are once transferred form the cassette onto the rack arranged within a vacuum chamber for supporting the target substrates. In this case, present invention can be employed for transferring the target substrates between the cassette and the rack. Also, a transfer apparatus may be designed such that it arms hold the upper surfaces of target substrates by utilizing vacuum suction, in place of holding the target substrate from below.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of transferring a plurality of target substrates by a transfer apparatus from a first holder to a second holder in a semiconductor processing system, said first holder holding a (KN+M)-number of target substrates in a stacked state with a distance therebetween, said second holder being capable of holding at least a (KN+M)-number of target substrates in a stacked state with a distance therebetween, and said transfer apparatus having an N-number of arms, which are movable back and forth simultaneously, for respectively supporting target substrates in a stacked state with a distance therebetween, where K is an integer of at least 2, N is an integer of at least 2, and M is an integer of at least 1 and smaller than N, said method comprising:

a first step of simultaneously transferring an N-number of target substrates, which are the lowermost ones of said (KN+M)-number of target substrates held in said first holder, from said first holder into said second holder by said N-number of arms;

a second step, after said first step, of simultaneously transferring an M-number of target substrates, which are the lowermost ones of a {(K−1)N+M}-number of target substrates left in said first holder, from said first holder into said second holder by an M-number of arms, which are the uppermost ones of said N-number of arms; and a third step, after said second step, of simultaneously transferring an N-number of target substrates, which are ones of a (K-l)N-number of target substrates left in said first holder, from said first holder into said second holder by said N-number of arms.

2. The method according to claim 1, wherein said M is an integer of at least 2.

3. The method according to claim 2, wherein said N is an integer of at least 4.

4. A method of transferring a plurality of target substrates by a transfer apparatus from a first holder to a second holder in a semiconductor processing system, said first holder being supposed to hold a (KN+M)-number of target substrates in a stacked state with a distance therebetween, said second holder being capable of holding at least a (KN+M)-number of target substrates in a stacked state with a distance therebetween, and said transfer apparatus having an N-number of arms, which are movable back and forth simultaneously, for respectively supporting target substrates in a stacked state with a distance therebetween, where K is an integer of at least 2, N is an integer of at least 2, and M is an integer of at least 1 and smaller than N, said method comprising:

a first step of causing said transfer apparatus to perform a movement for simultaneously transferring an N-number of target substrates, which are the lowermost ones of said (KN+M)-number of target substrates supposed to be held in said first holder, from said first holder into said second holder by said N-number of arms;

a second step, after said first step, of causing said transfer apparatus to perform a movement for simultaneously transferring an M-number of target substrates, which are the lowermost ones of a {(K−1)N+M}-number of target substrates supposed to be left in said first holder, from said first holder into said second holder by an M-number of arms, which are the uppermost ones of said N-number of arms; and a third step, after said second step, of causing said transfer apparatus to perform a movement for simultaneously transferring an N-number of target substrates, which are ones of a (K–1)N-number of target substrates supposed to be left in said first holder, from said first holder into said second holder by said N-number of arms.

5. The method according to claim 4, wherein said M is an integer of at least 2.

6. The method according to claim 5, wherein said N is an integer of at least 4.

7. The method according to claim 4, wherein said N-number of target substrates, which are supposed to be transferred in said third step, are the lowermost ones of said {(K–1)N}-number of target substrates supposed to be left in said first holder.

8. The method according to claim 4, wherein one of said N-number of arms is an independent arm capable of moving back and forth independently of the other arms.

9. The method according to claim 8, wherein one of said (KN+M)-number of target substrates supposed to be held in said first holder, is absent, so as to bring about a blank portion in said second holder, and said method further comprises a step, after said third step, of transferring a substitute substrate from another holder into said blank portion of said second holder by said independent arm.

10. The method according to claim 9, wherein said substitute substrate is a target substrate equivalent to one of said (KN+M)-number of target substrates.

11. The method according to claim 9, wherein said substitute substrate is a dummy substrate used exclusively for a substituting purpose.

12. A method of transferring target substrates, in a vertical heat treating system, said vertical heat treating system including (a) a container placing section for placing a plurality of containers in said system, each container being supposed to hold a (KN+M)-number of target substrates, which belong to a group of substrates having substantially the same outline size, in a stacked state with a distance therebetween, where K is an integer of at least 2, N is an integer of at least 2, and M is an integer of at least 1 and smaller than N, (b) a heat treating furnace for applying a heat treatment to a plurality of target substrates, which belongs to said group, held by a boat, said boat being capable of holding at least a (KN+M)-number of target substrates, which belongs to said group, in a stacked state with a distance therebetween, (c) a boat transport mechanism for transporting said boat between a position in said heat treating furnace and a transfer section outside said heat treating furnace, and (d) a transfer apparatus having an N-number of arms, which are movable back and forth simultaneously, for respectively supporting target substrates, which belongs to said group, in a stacked state with a distance therebetween, said transfer method being a method of transferring said (KN+M) number of target substrates supposed to be held in each of said containers placed in said container placing section, from said container into said boat placed in said transfer section, by using said transfer apparatus, comprising:

a first step of causing said transfer apparatus to perform a movement for simultaneously transferring an N-number of target substrates, which are the lowermost ones of said (KN+M)-number of target substrates supposed to be held in said container, from said container into said boat by said N-number of arms;

a second step, after said first step, of causing said transfer apparatus to perform a movement for simultaneously transferring an M-number of target substrates, which are the lowermost ones of a {(K–1)N+M}-number of target substrates supposed to be left in said container, from said container into said boat by an M-number of arms, which are the uppermost ones of said N-number of arms; and a third step, after said second step, of causing said transfer apparatus to perform a movement for simultaneously transferring an N-number of target substrates, which are ones of a (K-l)N-number of target substrates supposed to be left in said container, from said container into said boat by said N-number of arms.

13. The method according to claim 12, wherein said M is an integer of at least 2.

14. The method according to claim 13, wherein said N is an integer of at least 4.

15. The method according to claim 12, wherein said N-number of target substrates, which are supposed to be transferred in said third step, are the lowermost ones of said {(K–1)N}-number of target substrates supposed to be left in said container.

16. The method according to claim 12, wherein one of said N-number of arms is an independent arm capable of moving back and forth independently of the other arms.

17. The method according to claim 16, wherein one of said (KN+M)-number of target substrates supposed to be held in said container, is absent, so as to bring about a blank portion in said boat, and said method further comprises a step, after said third step, of transferring a substitute substrate from another holder into said blank portion of said boat by said independent arm.

18. The method according to claim 17, wherein said substitute substrate is a target substrate equivalent to one of said (KN+M)-number of target substrates.

19. The method according to claim 17, wherein said substitute substrate is a dummy substrate used exclusively for a substituting purpose.

20. The method according to claim 16, further comprising a step, after said third step, of transferring a monitoring substrate, for monitoring said heat treatment, from another holder into said boat by said independent arm.

* * * * *